United States Patent [19]

Sakamoto

[11] 4,411,728

[45] Oct. 25, 1983

[54] METHOD FOR MANUFACTURE OF INTERDIGITAL PERIODIC STRUCTURE DEVICE

[75] Inventor: Tsunenori Sakamoto, Ibaragi, Japan

[73] Assignees: Agency of Industrial Science & Technology; Ministry of International Trade & Industry, both of Tokyo, Japan

[21] Appl. No.: 248,961

[22] Filed: Mar. 30, 1981

[51] Int. Cl.³ ............................................. C30B 25/04
[52] U.S. Cl. .......................... 156/606; 156/DIG. 103; 148/175
[58] Field of Search ... 156/611, DIG. 103, DIG. 102, 156/606; 118/726; 427/85, 93, 124; 148/175, 189; 204/192 R, 192 S

[56] References Cited

U.S. PATENT DOCUMENTS 3,865,625  2/1975  Cho et al. ................. 156/DIG. 103
4,013,502  3/1977  Staples ...................... 156/DIG. 103

OTHER PUBLICATIONS

Applied Physics Letters, Cho V19, No. 11, Dec. 71, pp. 467–468.

Primary Examiner—Hiram H. Bernstein
Attorney, Agent, or Firm—Kurt Kelman

[57] ABSTRACT

In the manufacture of a superlattice by the MBE method, growth of an epitaxial film on a growth substrate is accomplished by disposing a P-type and an N-type impurity evaporation source at positions adjacent to a main evaporation source and symmetrical to each other relative to the main evaporation source and causing the molecular beams issuing from these evaporation sources to be projected through a mask onto the growth substrate. When the apparatus used for the aforementioned growth of the epitaxial film is additionally provided with a shutter adapted to open and close at least one of the impurity evaporation sources, the projections of the molecular beams can be controlled so as to produce an interdigital periodic structure element.

4 Claims, 9 Drawing Figures

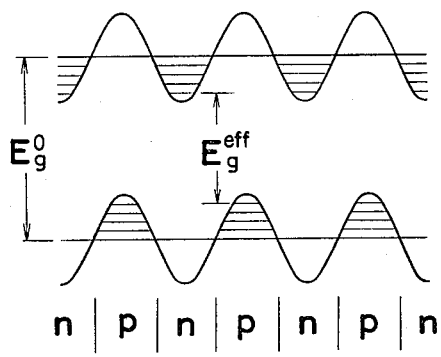
Fig_1(a)
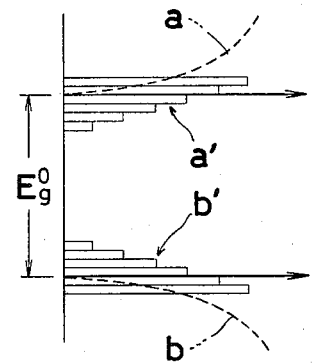
Fig_1(b)
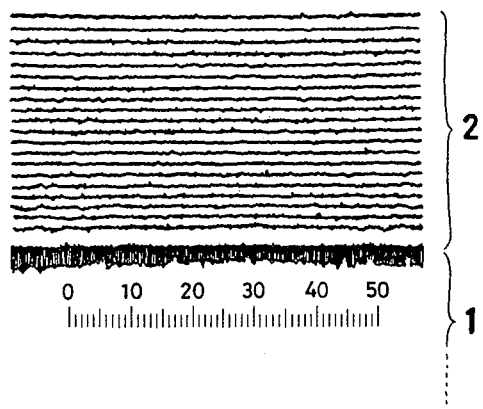
Fig_2
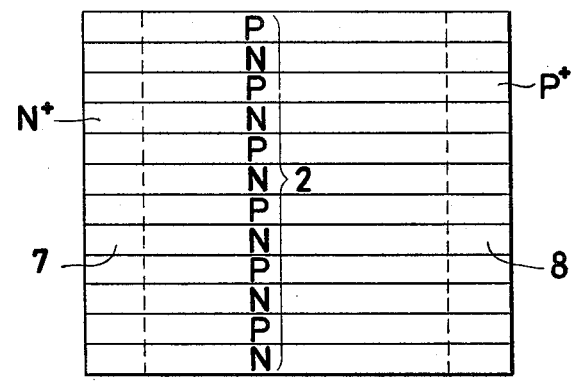
Fig_4
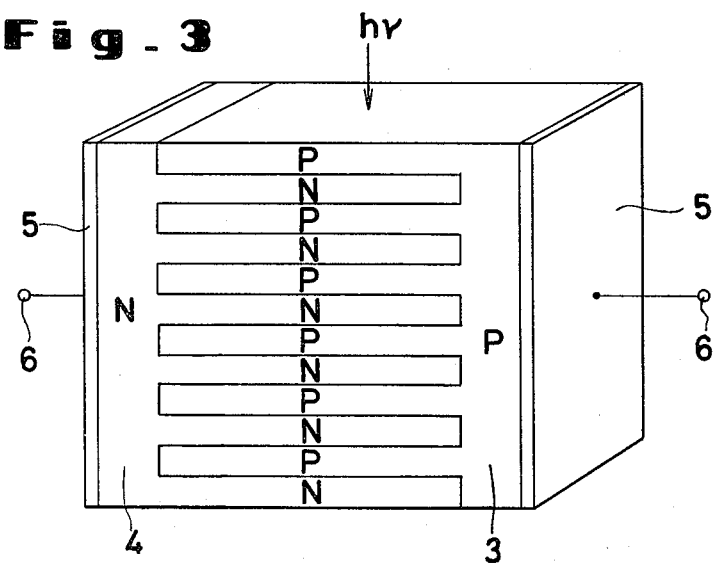
Fig_3

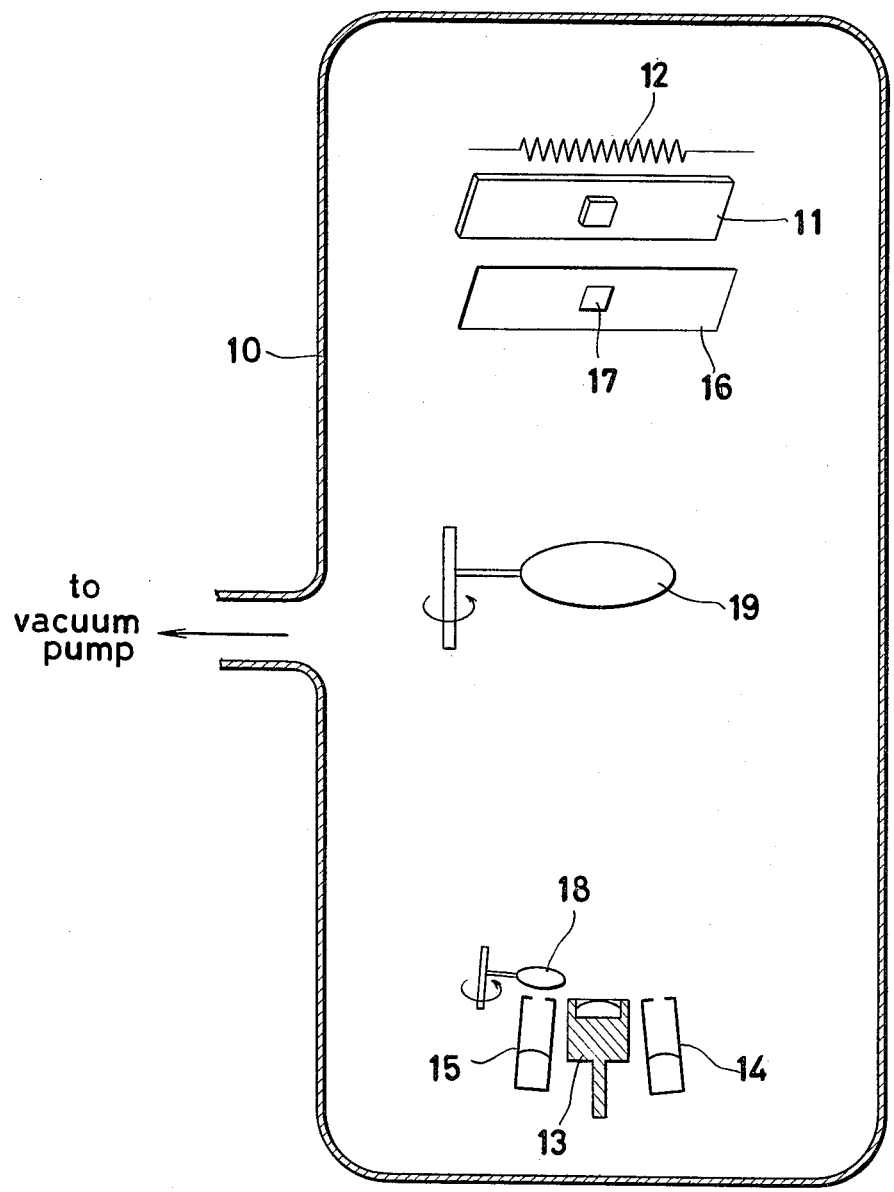

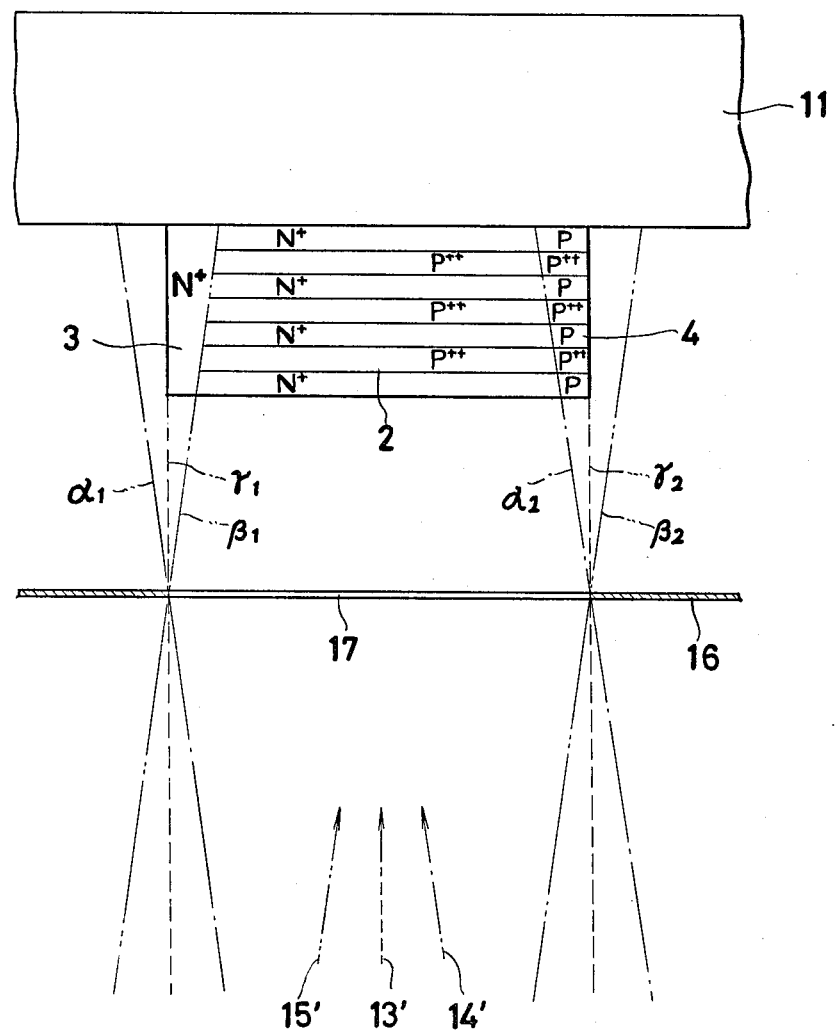

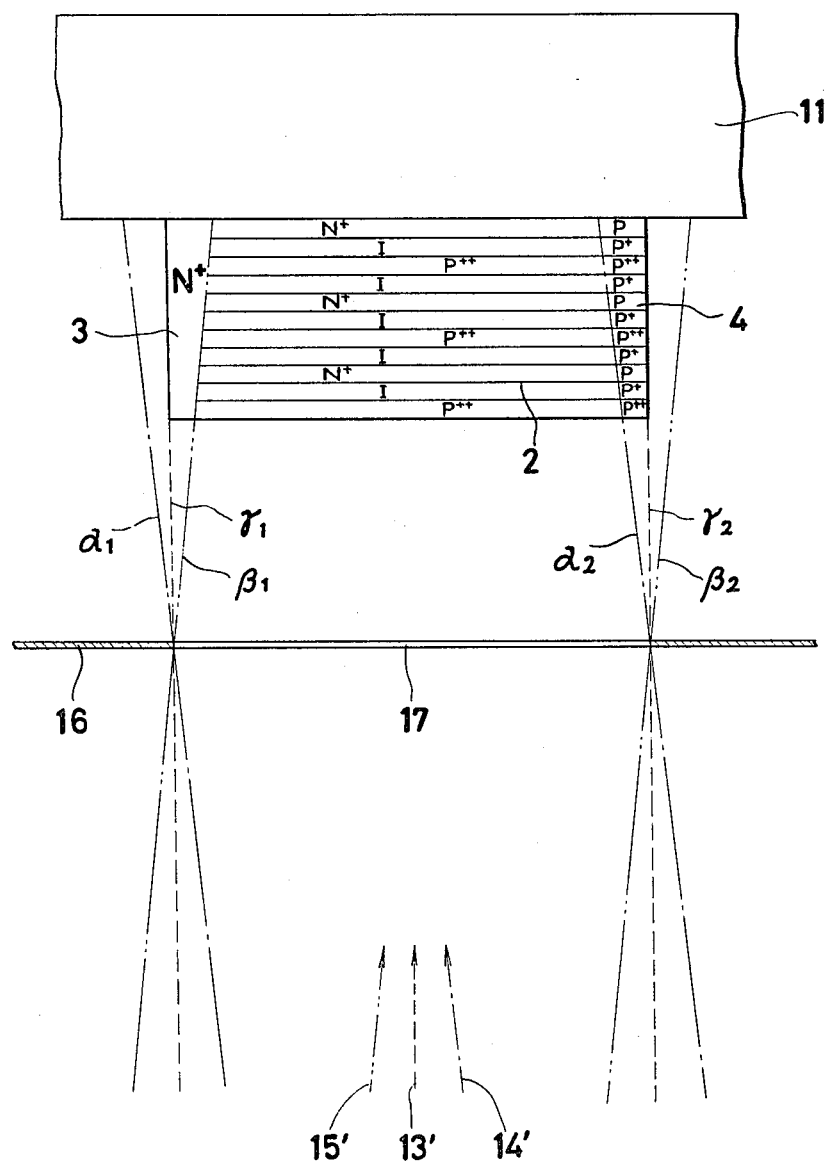

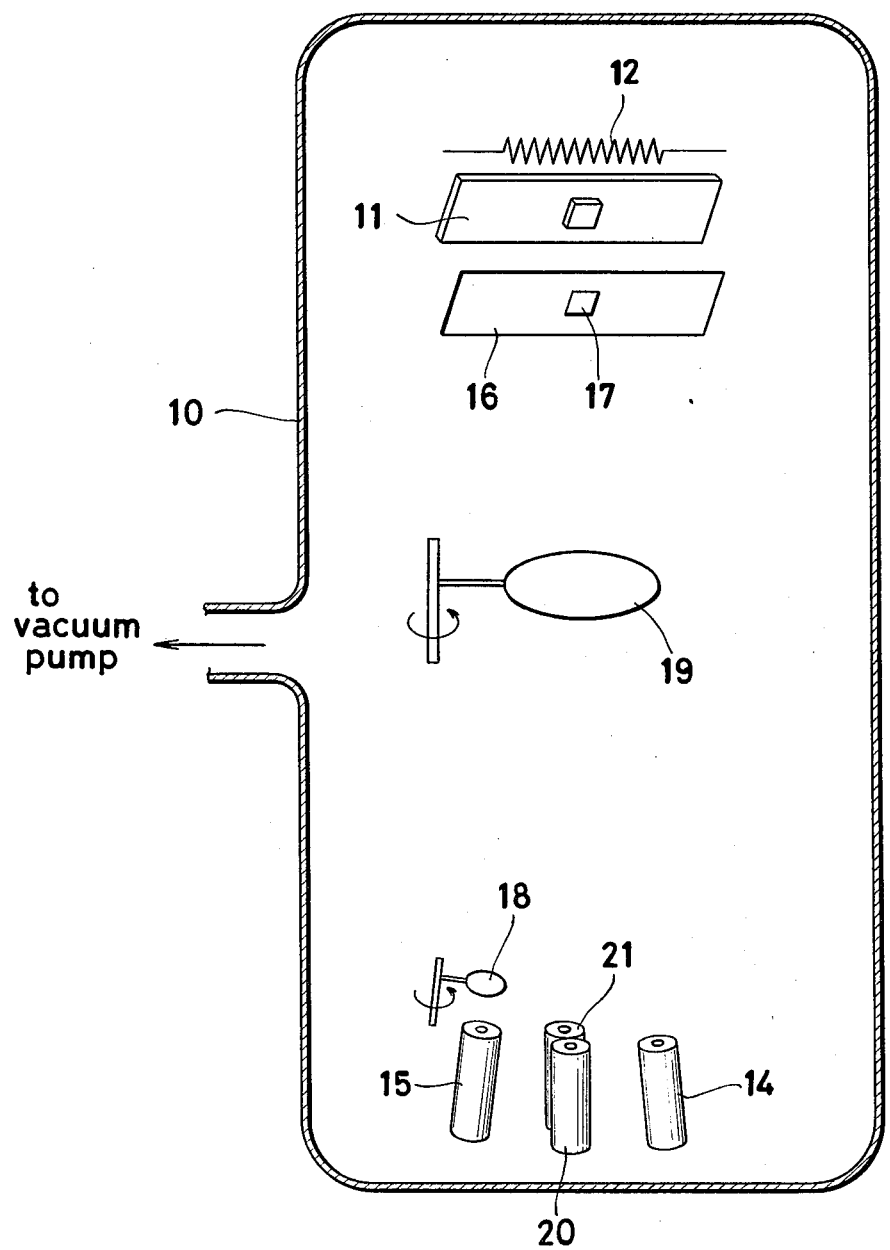

METHOD FOR MANUFACTURE OF INTERDIGITAL PERIODIC STRUCTURE DEVICE

BACKGROUND OF THE INVENTION

This invention relates to a method for the manufacture of an interdigital periodic structure device by the technique of molecular-beam epitaxial crystal growth, and more particularly to a method for the manufacture of an interdigital periodic structure device which is usable as a photodetecting device capable of highly efficient photoelectric conversion of beams of even long wavelength or as an FET.

The photodetector for converting radiant energy such as that of solar rays into electric energy possesses a hetero-junction structure of semiconductor materials or a PIN structure incorporating an interposed insulating film. On receiving a photon flux whose energy is greater than the energy gap in the forbidden band of the semiconductor materials, the semiconductor generates electrons in the conduction band and holes in the valence hand, and the electrons or holes are respectively transferred to the opposite electrodes, there to produce a terminal voltage. The photodetector, therefore, produces no terminal voltage when the incident energy is smaller than the energy gap in the forbidden band. Even when the incident energy is greater than the energy gap, the device's efficiency in photoelectric conversion is lowered if the wavelength in the peak in spectrum of the light deviates greatly from the energy gap. The solar battery using p-n junctions of single crystal Si elements manifests its maximum sensitivity when the wavelength of the incident light falls within the range of from 0.7 to 0.8 $\mu$m. It fails to operate with its highest efficiency, therefore, because in the spectrum of sunlight, the band of the maximum energy falls in the neighborhood of 0.5 $\mu$m. None of the Si photodetectors so far introduced have been able to provide efficient photoelectric conversion of light having wavelengths of 1 $\mu$m or more.

The semiconductor photodetector used in the optical communications are made from ternary or quaternary compound semiconductors so as to exhibit the maximum sensitivity to wavelengths of from 1.3 to 1.6 $\mu$m, the range in which the light transmittion loss of the optical fibers is minimized. They nevertheless have a disadvantage that they entail lattice defect or dislocation due to the lattice mismatching. From the standpoint of the processing of signals in the optical communications, the optical information transmitted through the optical fibers is required to undergo electrical arithmetic processing and control. Such an electric IC technique has already been established with respect to Si elements. A breakthrough which would enable lights of wavelengths exceeding 1 $\mu$m to be effectively detected by use of Si elements would contribute much to improving the compatibility of optical information with conventional electric IC elements.

G. H. Döhler of the Max-Plank Institute in West Germany has published a report purporting that it is theoretically possible to effect variation in the energy gap of the forbidden band by use of a doping superlattice structure. (J. Vac. Sci. Tech., 16 (3), pp. 851, 856 1979). This means that by use of a device having thin films of P-N type semiconductor in a periodic structure, an effective band gap of a smaller width than the band gap proper to the single-junction semiconductor can be materialized and that by adopting this superlattice structure in the photodetector, this photodevice can be made effectively operable with the beam of a greater wavelength than the highest possible wavelength with which the conventional single-junction structure devices have been operable.

Molecular beam epitaxy (MBE) is the optimum method available for producing such a superlattice structure. It is capable of forming thin crystal films free of crystal defects. By this method, it becomes feasible to obtain heterojunctions having a satisfactory lattice matching property. Particularly noteworthy is the fact that in this method the thickness of epitaxial layers and the distribution of impurities concentration can be controlled to an accuracy of some tens of Angstroms and the film thickness control can be effected on the order of 5 Å. ("Growth of Periodic Structures by the Molecular-Beam Method" by A. Y. Cho, Applied Physics Letters, Vol. 19, No. 11, 1st Dec. 1971, pp. 467–468)

A technique for producing this superlattice structure by use of the MBE has already been established. In spite of this established technique, no method has so far been developed which permits actual manufacture of photodetectors such as solar batteries. One seemingly feasible method would comprise forming a superlattice of a PN periodic structure, then causing diffusion or ion implantation of N+ impurities in one of the opposite end faces perpendicular to the P-N junction interface and of P+ impurities in the other end face, and finishing the entire lattice in the interdigital shape. However, since the finishing molding is performed at elevated temperatures, the impurities doped into the layered films are diffused so much as to make production of the desired structure infeasible.

SUMMARY OF THE INVENTION

One object of this invention is to provide a method for the manufacture of an interdigital periodic structure device, which enables the device to acquire the interdigital shape automatically in consequence of the epitaxial growth of crystals and consequent formation of periodic films by the technique of vacuum deposition.

To accomplish the object described above according to the present invention, there is provided a method for the manufacture of an interdigital periodic structure device by the vacuum evaporation of thin semiconductor films in a system comprising a growth substrate, an evaporation source of the main component element for the semiconductor film and evaporation sources of P and N impurities disposed opposite the growth substrate, a mask interposed between the evaporation sources and the growth substrate and a shutter disposed above at least one of the impurity evaporation sources and adapted to open and close the evaporation source during the growth period of the semiconductor film, whereby an interdigital periodic semiconductor film is formed on the growth substrate by self-aligned method.

While the vapor from the main evaporation source forms a film on the growth substrate, the vapors of impurities from the two impurity evaporation sources are projected on and doped on alternating regions to form P and N regions in the interdigital shape at the edge portions of the film. Thus, an interdigital PN periodic structure device is produced by providing only one of the two impurity evaporation sources with a shutter or an interdigital PINI periodic structure device is obtained by periodically varying the doping concentration by at least one of the two impurities during the epitaxial growth of semiconductor film. The aforementioned system for the vacuum evaporation of this invention, when additionally provided with a plurality of main evaporation source cells, can be applied to manufacture of compound semiconductor devices.

BRIEF EXPLANATION OF THE DRAWING

FIGS. 1(a) and 1(b) are an energy band diagram of a PN periodic structure and a diagram illustrating the density of energy states of electrons and holes.

FIG. 2 is a replica of the photomicrograph of an angle-lapped and stained surface of a PN periodic structure device formed on a Si substrate.

FIG. 3 is a schematic diagram of the basic structure of an interdigital PN periodic structure device.

FIG. 4 is a structural diagram of a device produced by diffusion or ion implantation.

FIG. 5 is a schematic diagram illustrating one embodiment of this invention, for the manufacture of an interdigital PN periodic structure device.

FIG. 6 is a cross sectional view of the interdigital PN periodic structure device manufactured by the method illustrated in FIG. 5.

FIG. 7 is a cross sectional view of an interdigital PINI periodic structure device to be manufactured by periodically varying the doping concentration of impurity from the evaporation source 15 in the system of FIG. 5.

FIG. 8 is a schematic diagram illustrating another embodiment of the present invention intended for manufacture of binary-element semiconductors.

DESCRIPTION OF THE PREFERRED EMBODIMENT

This invention relates to a method for the manufacture of an interdigital periodic structure device by the technique of vacuum evaporation.

FIG. 1 represents diagrams for illustrating the underlying principle of the method of the present invention which permits a desired variation to be obtained in the band gap of the forbidden band in the doping superlattice structure proposed by D. H. Döhler as described above. When the P and N layers in the semiconductor are caused to grow periodically in a multilayer of at least some tens of layers each of a very small thickness even less than the Debye length, for example, the produced semiconductor acquires energy bands as illustrated in the diagram of FIG. 1(a) wherein $E_g^O$ denotes the amplitude of the forbidden band proper to the semiconductor. By the quantum electrodynamic effect, the produced semiconductor acquires a density of energy states of electrons and holes as illustrated in FIG. 1(b), with the sub-bands a', b' of electrons and holes, formed in the conduction band a and the valence band b, respectively (illustrated in the form of electron and hole state densities respectively in the diagram). Consequently, the energy states of electrons and holes are allowed to exist within the amplitude $E_g^O$ of the forbidden band proper to the semiconductor. Because of the transition between the sub-bands of the adjoining P and N layers, therefore, the actual forbidden band in this periodic structure is limited to the amplitude $E_g^{eff}$ shown in FIG. 1(a). The semiconductor, accordingly, is capable of absorbing a beam of energy having an amplitude of $E_g^{eff}$ which is smaller than the amplitude of $E_g^O$, namely a beam having a greater wavelength, and consequently generating electron-hole pairs in the periodic structure. On the basis of this principle, the actually available band gap can be varied and consequently the fundamental absorption edges can be varied by suitably varying the thicknesses of the individual P and N layers and the concentrations of the P and N impurities in the PN periodic structure.

The inventor has ascertained that periodic growth of P and N layers of an extremely small thickness as described is practicable by the method of this invention. FIG. 2 represents a replica of the photomicrograph of the periodic structure involving such P and N layers.

The structure of FIG. 2 is the outcome of the growth of Si single crystal thin film formed on an N(100)Si substrate 1 by evaporating a non-dope single crystal Si with the electron beam in an ultra-high vacuum in the order of $10^{-9}$ Torrs. During the growth of the film, Ga and Sb as P and N impurities, respectively, are evaporated by using Knudsen ovens and are caused to dope the semiconductor films in an alternating manner by alternately opening and closing the shutter to produce a PN periodic structure 2. The growth temperature is about 600° C. and the thickness of each P and N layer is 350 Å. The photomicrograph shows the precise doping profile of the impurities on the surface which is angle-lapped and stained with a $HNO_3$:HF solution. In FIG. 2, black portions represent P layers and white portions N layers respectively. The growth temperature for the epitaxial film of FIG. 2 is lower than that of the ordinary CVD method (more than about 1000° C.) and the dopants are distributed substantially in a stepped condition. Optionally, a PN periodic structure involving a still smaller layer thickness may be produced by the method of this invention.

The basic structure of a device for drawing out, in the form of an electric current, those electron-hole pairs generated by the absorption of a beam according to the aforementioned principle is illustrated in FIG. 3.

It is seen from the diagram that the individual P layers and N layers in the PN periodic structure are respectively joined in the region 3 and region 4 formed along their edge surfaces perpendicular to the junction interfaces, giving rise to the so-called interdigital PN periodic structure. Owing to this structure, the holes and electrons generated in the individual P layers and N layers of the PN periodic structure are gathered in the opposite terminal regions 3, 4 and are drawn out, in the form of an electric current, through the terminals 6 attached to the respective electrodes 5. One possible method available for the manufacture of such an interdigital PN periodic structure may resort to a procedure which involves forming a PN periodic structure as illustrated in FIG. 4, and subsequently causing diffusion or ion-implantation of N+ (or P+) impurities and P+ (or N+) impurities respectively in the terminal region 7 and the terminal region 8 formed perpendicularly to the PN junction interfaces. Since this PN periodic structure is manufactured at a low growth temperature within the range of from 600° to 700° C. in an ultra-high vacuum as described above, the impurities diffused or ion implanted into the P layers and N layers of the periodic structure, on exposure to the temperature involved in the diffusion of impurities during the formation of the interdigital structure (more than 1000° C.) or the temperature involved in the thermal treatment performed subsequently to the step of ion implantation (more than 900° C.), are diffused so much as to render the production of the desired structure impracticable.

This invention overcomes the aforementioned drawbacks of the conventional method and permits the interdigital periodic structure device to be formed automatically in consequence of the epitaxial growth of crystal films by vacuum evaporation.

FIG. 5 represents one embodiment of the present invention. In an ultra-high vacuum chamber 10, a growth substrate 11 and a heater 12 adapted to apply heat to the substrate 11 are disposed, and an evaporation source 13 containing a main semiconductor material used for the growth of a semiconductor film and P-type (or N-type) impurities is disposed in a direction perpendicular to the main plane of the growth substrate 11, and evaporation sources 14 and 15 for doping the N-type and P-type impurities in the aforementioned semiconductor films are disposed at positions symmetrical to each other relative to the evaporation source 13. Further, a mask 16 is interposed between the growth substrate 11 and the evaporation sources 13, 14 and 15, and this mask 16 is provided with a hole 17 of size and shape sufficient from the standpoint of the evaporation sources 13, 14 and 15 for the purpose of producing a PN periodic structure device. It is through this hole 17 that the growth substrate 11 is exposed to the incident beams. The evaporation source 15 is provided adjacently to the vapor outlet thereof with a shutter 18 which is adapted to intercept, at controlled intervals, the molecular beam of vapor particles issuing from the evaporation source 15 without offering any interference to the molecular beams of vapor particles issuing from the other evaporation sources 13, 14. By 19 is denoted a main shutter intended for all the evaporation sources.

In an apparatus constructed as described above, the vacuum evaporation is carried out in the following conditions. Let $N_A$ (or $N_D$) stand for the impurity concentration in the epitaxial films produced by only the molecular beam from the evaporation source 13, let $N_D^+$ (or $N_A^+$), stand for the impurity concentration in the epitaxial films produced simultaneously by the molecular beams from the evaporation sources 13 and 14, and let $N_A^{++}$ (or $N_D^{++}$), stand for the impurity concentration in the epitaxial films produced simultaneously by the molecular beams from the evaporation sources 13 and 15. The operation of the apparatus is controlled so that these concentrations of impurities will satisfy the following relationship.

$$N_A << N_D^+ << N_A^{++} \text{ (or}$$
$$N_D << N_A^+ << N_D^{++})$$

The growth of the interdigital PN periodic structure device, in accordance with the aforementioned relationship of the concentrations of impurities, is started by heating the growth substrate 11 and the evaporation sources 13, 14 and 15 until temperature stability is reached and subsequently opening the main shutter 19. In this case, the concentrations of impurities deposited in the produced semiconductor film can be distributed as shown in FIG. 6 by opening and closing the shutter 18 of the evaporation source 15 during the growth of the film at intervals suitably selected by monitoring the film thickness monitor (not shown).

In FIG. 6, 16 denotes the mask and 13', 14' and 15' denote the directions in which the vapor particles issuing from the evaporation sources 13, 14 and 15 in FIG. 5 advance. In FIG. 6, the spaces between the two opposed dotted lines $\gamma_1 - \gamma_2$, two single dashed lines $\alpha_1 - \alpha_2$ and two dual-dashed lines $\beta_1 - \beta_2$ represent the beam widths limited by the edges of the hole 17 in the mask 16. In the grown semiconductor film on the growth substrate 11, the region defined by the dual-dashed line $\beta$HD 1 and the single-dashed line $\alpha_2$ is formed of a P++N+ (or P+N++) periodic structure having alternate impurity concentrations of $N_D^+$ and $N_A^{++}$ (or $N_A^+$ and $N_D^{++}$). In the terminal portion perpendicular to the PN junctions of the semiconductor film, namely the region 3 defined by the dotted line $\gamma_1$ and the dual-dashed line $\beta_1$, since it is not reached by the vapor particles from the evaporation source 15, there is formed an N+ layer (or P+ layer) having the impurity concentration of $N_D^+$ (or $N_A^+$). In the perpendicular terminal portion opposite the region 3, namely the region 4 defined by the dotted line $\gamma_2$ and the single-dashed line $\alpha_2$, since it is not reached by the vapor particles from the evaporation source 14, there is formed a P++P layer (or N++N layer) having alternate impurity concentrations of $N_A$ and $N_A^{++}$ (or $N_D$ and $N_D^{++}$). The interdigital PN periodic structure shown in FIG. 6, therefore, is capable of realizing the basic interdigital PN periodic structure shown in FIG. 3.

The PINI periodic structure can be materialized by using the apparatus of the construction as illustrated in FIG. 5. In this case, the vacuum evaporation is carried out in the following conditions: Let $N_A$ (or $N_D$) stand for the impurity concentration in the epitaxial films produced by only the molecular beam from the evaporation source 13, let $N_D^+$ (or $N_A^+$) stand for the impurity concentration in the epitaxial films produced simultaneously by the molecular weight beams from the evaporation sources 13 and 14, and let $N_A^{++}$ and $N_A^+$ (or $N_D^{++}$ and $N_D^+$) stand for the impurity concentration in the epitaxial films produced simultaneously by the molecular beams from the evaporation sources 13 and 15. In this case, the operation of the apparatus is controlled so that these concentrations of impurities will satisfy the following relationship.

$$N_A^+ = N_D^+$$

$$N_A << N_D^+ << N_A^{++} \text{ (or}$$
$$N_D << N_A^+ << N_D^{++})$$

The production of such two values of concentrations of impurities as $N_A^{++}$ and $N_A^+$ (or $N_D^{++}$ and $N_D^+$) can be obtained by varying the temperature of the impurity cell 15 and controlling the amount of vapor particles issued from the cell, or by varying the temperature of the growth substrate thereby adjusting the sticking coefficient of the impurities, or by ionizing the vapor particles issued from the cell 15 and adjusting the ratio of the ionization.

When the amount of the vapor particles which are issued from the impurity cell 15 and dope the growth substrate under the growth conditions described above is regulated by opening the shutter 18 similarly to the vacuum evaporation of FIG. 6 so as to give rise to the two impurity concentrations of $N_A^{++}$ and $N_A^+$ (or $N_D^{++}$ and $N_D^+$), the semiconductor film obtained consequently acquires a cross section as shown in FIG. 7.

To be specific, when the doping amount of the vapor particles from the cell 15 is fixed at $N_A^{++}$, the film grown in the region 2 has the carrier concentration of $N_A^{++}$. When the doping amount is fixed at $N_A^+$, the film grown in the same region becomes intrinsic because this doping amount is compensated for by the doping amount $N_D^+$ ($\because N_A^+ = N_D^+$) of the vapor particles from the cell 14. When the doping operation is controlled at suitable time intervals, therefore, a PINI periodic structure is formed in the region 2, an N+-structure in the region 3 and a P-structure of the type of PP+P++ in the region 4, respectively, in the grown film, giving rise to a PINI interdigital periodic structure, as illustrated in FIG. 7.

As described above, the method of the present invention permits a number of interdigital PN periodic structure device to be automatically produced at once by controlling the operation of the shutter and using the mask on the growth substrate during the growth of a PN periodic structure by the technique of vacuum evaporation. Thus, it constitutes a highly important technical achievement.

Needless to say, the method wherein ionized impurity sources are used in the place of the evaporation sources 14, 15 and the amounts of impurity ions directed to the growth substrate 11 are controlled by means of an electric field or magnetic field embraced in the scope of the present invention.

Further, the method wherein a semiconductor material intentionally excluding impurities is used as the evaporation source 13 so that in the produced periodic structure, a P++I (or N++I) structure is formed and/or a P++P (or N++N) structure is formed under the influence of an ambient gas etc. in the region 4 of the cross section of FIG. 6 is also embraced in the idea of this invention.

Now, a working example of this invention will be described with reference to the diagram of FIG. 5. Within a vacuum chamber maintained under an atmosphere of ultra-high vacuum in the order of $10^{-9}$ Torrs, an electron gun is used as the evaporation source 13 to issue a beam of P-type Si. As the evaporation sources 14, 15 opposed to each other across the electron gun, Knudsen cells filled respectively with Sb and Ga are installed. The Sb and Ga are respectively heated at the cell temperatures of about 300° C. and about 750° C. and are vaporized in the form of single molecule. At a distance of about 20 cm upward from the evaporation sources 13, 14 and 15, the mask 16 is disposed. The growth substrate 11 of Si(100) heated to a temperature within the range of from 600° to 700° C. is disposed at a distance of about 1 cm upward from the mask 16. After the evaporation sources 13 through 15 and the growth substrate 11 have reached their respective stable temperatures, the main shutter is opened to allow growth of a single crystal thin film of Si at a growth rate of about 1 Å/sec. In this case, the shutter 18 is opened and closed at fixed intervals of about 6 minutes. When this procedure is continued for about three hours under the conditions described above, there is obtained an interdigital PN periodic structure device as illustrated in FIG. 6. Part of the cross section of the periodic structure which is obtained under such growth conditions is as illustrated in FIG. 2. In this case, the approximate impurity concentrations are: $N_A \simeq 10^{15}/cm^{-3}$, $N_D + \simeq 10^{16}/cm^{-3}$ and $N_A++ \simeq 10^{17}/cm^{-3}$.

When an insulating substrate such as a substrate of sapphire is used as the growth substrate 11, the method of this invention yields entirely the same results as described above. The embodiment described in detail above represents a case wherein the present invention is applied to a mono-polar semiconductor as Si. Another embodiment of this invention which is applicable to a compound semiconductor such as GaAs is illustrated in FIG. 8.

In this case, two Knudsen cells 20, 21 filled respectively with Ga and As are adjoiningly disposed as the evaporation sources in an upright position at the center of the line connecting the evaporation sources 14, 15.

As described in detail above, the present invention forms a semiconductor film on the growth substrate by disposing a P-type impurity evaporation source and an N-type impurity evaporation source adjacently to an evaporation source of the main component element of the semiconductor film and alternately opening and closing the shutter disposed above at least one of the impurities evaporation sources. This invention, therefore, permits automatic production of an interdigital PN periodic structure semiconductor film and, therefore, constitutes a highly significant technical achievement.

What is claimed is:

1. In a method for manufacturing an interdigital periodic structure device, comprising the steps of:
   (a) disposing a growth substrate and a heater arranged to apply heat to said substrate in an ultra-high vacuum chamber;
   (b) disposing a main evaporation source substantially opposite said substrate for evaporating a main semiconductor material so as to form thin semiconductor films on said substrate;
   (c) interposing a mask defining a hole between said substrate and said main evaporation source in the vicinity of said substrate;
   (d) disposing a p-type impurity evaporation source near one side of, and adjacent said main evaporation source so as to dope said semiconductor films except one side part thereof with said p-type impurity through said hole defined in said mask;
   (e) disposing an n-type impurity evaporation source adjacent said main evaporation source and placed substantially symmetrically thereabout with respect to said p-type impurity evaporation source so as to dope the semiconductor films except the other side part thereof with an n-type impurity through said hole defined in said mask;
   (f) interposing a main shutter having open and closed states between said substrate and said main- and said impurity-evaporation sources;
   (g) disposing another shutter between at least one of said impurity evaporation sources and said substrate so as to control doping of said semiconductor films from said one of said impurity evaporation sources;
   (h) allowing molecular beams of at least one element from said main- and from said impurity-evaporation sources to be evaporated and projected through said hole defined in said mask onto said substrate, while heating said substrate; and
   (i) alterately opening and closing said other shutter at time intervals when said main shutter is in said open state.

2. The method according to claim 1, wherein ion sources are used as said P-type and N-type impurity evaporation sources and the projection of ions from said sources to said growth substrate is controlled at fixed time intervals by means of an electric field or magnetic field.

3. The method according to claim 1, wherein the element in said main evaporation source is evaporated by means of an electron beam and the elements in said impurity evaporation sources are evaporated by application of heat.

4. The method according to claim 1, wherein said main evaporation source is composed of two Knudsen cells filled with different elements.

* * * * *